(12) United States Patent  
Shino

(10) Patent No.: US 6,940,106 B2  
(45) Date of Patent: Sep. 6, 2005

(54) SEMICONDUCTOR DEVICE FORMED IN SEMICONDUCTOR LAYER ON INSULATING FILM

(75) Inventor: Tomoaki Shino, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 32 days.

(21) Appl. No.: 10/661,906

(22) Filed: Sep. 12, 2003

(65) Prior Publication Data

US 2004/0212018 A1 Oct. 28, 2004

(30) Foreign Application Priority Data

Apr. 25, 2003 (JP) .................................. 2003-121630

(51) Int. Cl.[7] .............................................. H01L 27/11
(52) U.S. Cl. ..................... 257/206; 257/351; 257/369; 257/903
(58) Field of Search ................................. 257/204, 206, 257/351, 369, 390, 903

(56) References Cited

U.S. PATENT DOCUMENTS 5,698,893 A * 12/1997 Perera et al. ............... 257/627
5,795,800 A * 8/1998 Chan et al. ................. 438/149
5,886,388 A * 3/1999 Wada et al. ................ 257/393
5,930,163 A   7/1999 Hara et al.
6,015,996 A * 1/2000 Lee ............................ 257/393
6,791,200 B2 * 9/2004 Nii ............................. 257/903

FOREIGN PATENT DOCUMENTS

JP          10-178110      6/1998

* cited by examiner

Primary Examiner—Stephen W. Smoot
(74) Attorney, Agent, or Firm—Frommer Lawrence & Haug LLP

(57) ABSTRACT

First and second MOS transistors are formed in first and second active areas, respectively, and their gates are configured from a first gate electrode in the first and second transistors. Third and fourth MOS transistors are formed in the second and a third active areas, respectively, and their gates are configured from second and third gate electrodes in the third and fourth transistors. Fifth and sixth MOS transistors are formed in a fourth active area, and their gates are configured from the third and fourth gate electrodes in the fifth and sixth transistors. An end portion of the first gate electrode projecting from the first active area is obliquely arranged relative to a gate width direction of the first transistor, and an end portion of the third gate electrode projecting from the third active area is obliquely arranged relative to a gate width direction of the fourth transistor.

26 Claims, 4 Drawing Sheets

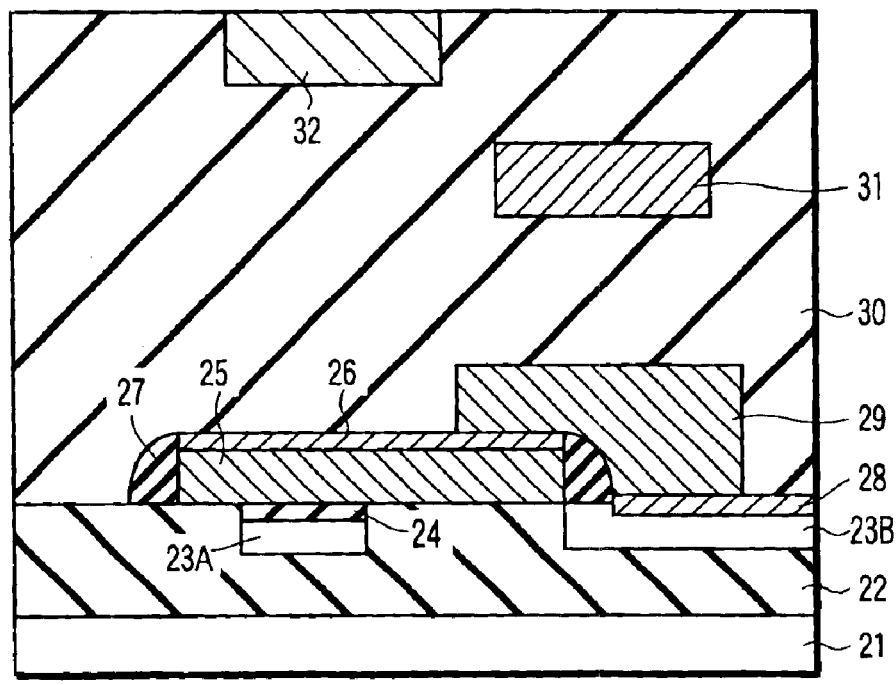
F I G. 5
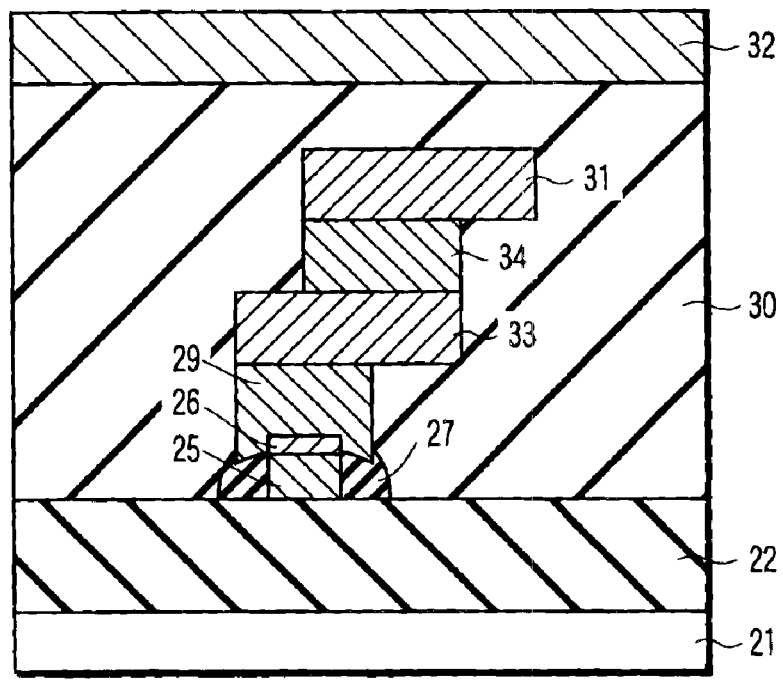
F I G. 6

SEMICONDUCTOR DEVICE FORMED IN SEMICONDUCTOR LAYER ON INSULATING FILM

CROSS-REFERENCE TO RELATED APPLICATIONS

This application is based upon and claims the benefit of priority from the prior Japanese Patent Application No. 2003-121630, filed Apr. 25, 2003, the entire contents of which are incorporated herein by reference.

BACKGROUND OF THE INVENTION

1. Field of the Invention

The present invention relates to a semiconductor device formed in a semiconductor layer on an insulating film, particularly relates to a static random access memory formed in a semiconductor layer on an insulating film.

2. Description of the Related Art

A semiconductor memory typified by a static random access memory (hereinafter referred to as SRAM) is recently produced in the form of a large scale integrated circuit more and more. In order to realize the large scale SRAM, it is strongly desired that a cell layout can reduce a cell area and suppress difficulty of a manufacturing process.

Conventionally, various kinds of layouts of a six-transistor type of SRAM cell which is constituted by six transistors are disclosed (for example, see Jpn. Pat. Appln. KOKAI Publication No. 10-178110). FIG. 1 shows an example of a layout different from the layout disclosed in Jpn. Pat. Appln. KOKAI Publication No. 10-178110. These two layouts shown in FIG. 1 and Jpn. Pat. Appln. KOKAI Publication No. 10-178110 are characterized in that, when a pattern in the cell is rotated 180 degrees about point C, the pattern is superimposed on the original pattern and adjacent cells become the line-symmetry pattern having a line of symmetry as a cell boundary line. These layouts have a relatively larger margin in a resist forming process, so that it is expected as the future layout of the miniaturized SRAM cell.

The layout shown in FIG. 1 has a butting diffusion where an N+ type of diffusion layer is adjacent to a P+ type of diffusion layer. When the butting diffusion is used, the area of the SRAM cell can be reduced compared with the layout disclosed in Jpn. Pat. Appln. KOKAI Publication No. 10-178110. The layout shown in FIG. 1 is one which is useful in connecting the N+ type of diffusion layer to the P+ type of diffusion layer by using a thin-film SOI substrate, which has a silicon layer (thickness of about 100 nm) formed on the insulating film, and by using silicide bonded to the diffusion layer without forming a well region. The SOI (Silicon On Insulator) substrate is a substrate having the structure in which the semiconductor layer such as a silicon layer is formed on the insulating film.

In an SRAM cell 101 shown in FIG. 1, a shared contact SC commonly connected to a gate electrode GL and an active area AA is formed with a hole extending over the gate electrode GL and the active area AA. The area of the SRAM cell 101 can be reduced by using the shared contact SC. Reference symbol CVC indicates a contact supplied with power supply voltage Vcc, CVS indicates a contact supplied with reference electric potential Vss, and CBL indicates a contact connected to a bit line, respectively.

However, there are some problems in the above-described cell layout shown in FIG. 1.

First, in a narrow space between the gate electrodes with a length of about 0.1 μm, which is indicated by D1 in FIG. 1, since it is very difficult to form a mask and there is a smaller margin of a process forming a resist pattern, deviation in size of the space between the gate electrodes is increased. Accordingly, it is very difficult to produce the large scale SRAM with good reproducibility.

Secondly, in a narrow space between the gate electrodes, which is indicated by D2 in FIG. 1, there is a problem that a resist residue is easily caused by a projection indicated by P, i.e. compared with the case of absence of the projection, and the margin of the process forming the resist pattern is small.

Thirdly, in the size in a major axis direction of the shared contact SC, variation is larger than that in a minor axis direction. This is because there is the variation in the mask forming process and the resist forming process. Consequently, there is the problem that the size in a longitudinal direction (short-side direction) of the SRAM cell 101 can not be reduced because of concerns about a short circuit to the adjacent gate electrode.

In the fourth, it is necessary in the layout shown in FIG. 1 to secure a distance of an extent of resolution limit of lithography as an isolation width, indicated by D3, between p-channel MOS transistors. A width in a lateral direction, indicated by D4, between the adjacent regions is required to secure the distance, considering misalignment of the resist mask in ion implantation of an N-type impurity and a P-type impurity. Accordingly, there is the problem that the size in a lateral direction (long side direction) of the SRAM cell 101 can not be reduced.

BRIEF SUMMARY OF THE INVENTION

According to an aspect of the present invention, there is provided a semiconductor device comprising: a first conductive type of first MOS transistor which is formed in a first active area and in which a gate is configured from a first gate electrode, the first gate electrode having an end portion projecting from the first active area; a second active area arranged adjacent to the first active area; a second conductive type of second MOS transistor which is formed in the second active area and in which a gate is configured from the first gate electrode; a second conductive type of third MOS transistor which is formed in the second active area and in which a gate is configured from a second gate electrode; a third active area formed apart from the first active area; a first conductive type of fourth MOS transistor which is formed in the third active area and in which a gate is configured from a third gate electrode, the third gate electrode having an end portion projecting from the third active area; a fourth active area arranged adjacent to the third active area; a second conductive type of fifth MOS transistor which is formed in the fourth active area and in which a gate is configured from the third gate electrode; and a second conductive type of sixth MOS transistor which is formed in the fourth active area and in which a gate is configured from a fourth gate electrode, wherein the end portion of the first gate electrode projecting from the first active area is obliquely arranged relative to a gate width direction of the first MOS transistor, and the end portion of the third gate electrode projecting from the third active area is obliquely arranged relative to a gate width direction of the fourth MOS transistor.

BRIEF DESCRIPTION OF THE SEVERAL VIEWS OF THE DRAWING

FIG. 5 is a sectional view taken along line A–B of the semiconductor device shown in FIG. 4;

FIG. 6 is a sectional view taken along line E–F of the semiconductor device shown in FIG. 4;

DETAILED DESCRIPTION OF THE INVENTION

Figure 1:
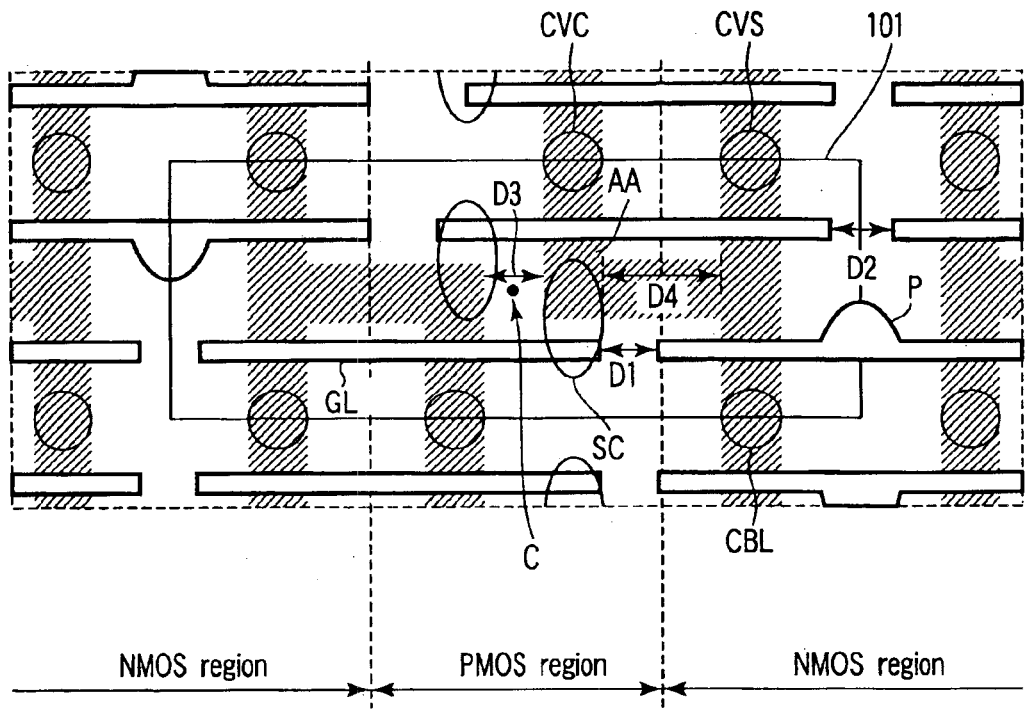
FIG. 1 is a plan view showing a configuration of a semiconductor device having a conventional SRAM cell.

Referring to the accompanying drawings, preferred embodiments of the invention will be described below. In the following description, common areas and regions are indicated with common reference numerals and signs.

First Embodiment

A semiconductor device according to a first embodiment of the invention will be described at first.

Figure 2:
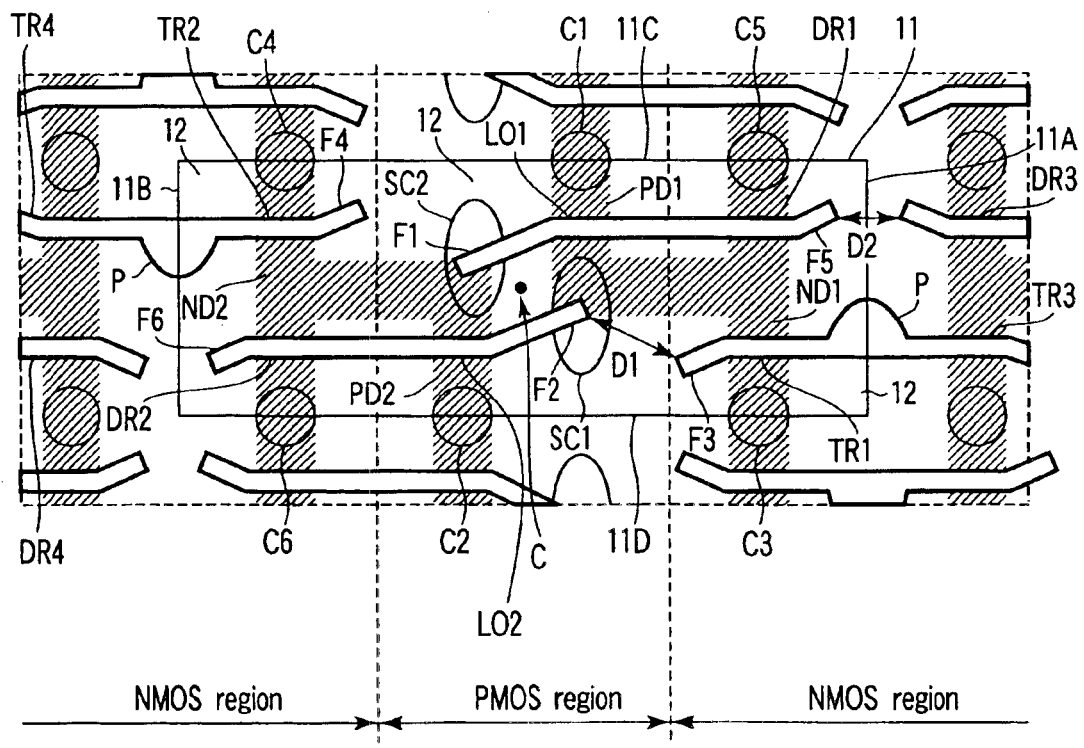
FIG. 2 is a plan view showing a configuration of a semiconductor device having a six-transistor type of SRAM cell formed on an SOI substrate according to a first embodiment of the invention.

FIG. 2 is a plan view showing a configuration of a semiconductor device having a six-transistor type of SRAM cell formed on an SOI substrate according to the first embodiment of the invention.

A load transistor LO1, a transfer transistor TR1, and a driver transistor DR1 are arranged in the SRAM cell 11 of the silicon semiconductor layer on the insulating film. Further, in the SRAM cell 11, a load transistor LO2, a transfer transistor TR2, and a driver transistor DR2 are arranged at point symmetry on the basis of point C relative to the load transistor LO, the transfer transistor TR1, and the driver transistor DR1.

A PMOS region where the p-channel MOS transistor is formed is arranged in the SRAM cell 11. Two NMOS region where the n-channel MOS transistor is formed are also arranged so as to sandwich the PMOS region. Active areas (device areas) PD1 and PD2, which are separated by an isolation area 12, are formed in the PMOS region. The active areas PD1 and PD2 include a semiconductor area such as a silicon layer. The load transistor LO1 which is the p-channel MOS transistor is formed in the active area PD1, and the load transistor L02 which is the p-channel MOS transistor is formed in the active area PD2.

An active area (device area) ND1, which is separated by the isolation area 12, is formed in an NMOS region on the right side of the PMOS region. The active area ND1 includes a semiconductor area such as a silicon layer. The transfer transistor TR1 and the driver transistor DR1 which are the n-channel MOS transistor are formed in the active area ND1.

An active area (device area) ND2, which is separated by the isolation area 12, is formed in an NMOS region on the left side of the PMOS region. The active area ND2 includes a semiconductor area such as a silicon layer. The transfer transistor TR2 and the driver transistor DR2 which are the n-channel MOS transistor are formed in the active area ND2.

On the right side of the SRAM cell 11 in FIG. 2, the SRAM cell 11 is formed at line symmetry on the basis of a boundary line 11A of the SRAM cell 11. That is, a driver transistor DR3 is arranged to be adjacent to the right side of the driver transistor DR1 and a transfer transistor TR3 is arranged to be adjacent to the right side of the transfer transistor TR1.

Similarly, on the left side of the SRAM cell 11 in FIG. 2, the SRAM cell 11 is formed at line symmetry on the basis of a boundary line 11B of the SRAM cell 11. That is, a driver transistor DR4 is arranged to be adjacent to the left side of the driver transistor DR2 and a transfer transistor TR4 is arranged to be adjacent to the left side of the transfer transistor TR2.

On the upper side of the SRAM cell 11 in FIG. 2, the SRAM cell 11 is formed at line symmetry on the basis of a boundary line 11C of the SRAM cell 11. Further, on the lower side of the SRAM cell 11 in FIG. 2, the SRAM cell 11 is formed at line symmetry on the basis of a boundary line 11D of the SRAM cell 11.

A contact C1 supplied with the power supply voltage Vcc is formed on one side of the active area PD1 where the load transistor LO1 is formed. A shared contact SC1 commonly connected to the other side of the active area PD1 and a gate fringe F2 of the load transistor LO2 is formed on the other side of the active area PD1 and on the gate fringe F2. Similarly, a contact C2 supplied with the power supply voltage Vcc is formed on one side of the active area PD2 where the load transistor LO2 is formed. A shared contact SC2 commonly connected to the other side of the active area PD2 and a gate fringe F1 of the load transistor LO1 is formed on the other side of the active area PD2 and on the gate fringe F1.

A contact C3 connected to a bit line is formed on one side of the active area ND1 where the transfer transistor TR1 is formed. Similarly, a contact C4 connected to the bit line is formed on one side of the active area ND2 where the transfer transistor TR2 is formed.

A contact C5 supplied with the reference electric potential Vss is formed on the other side of the active area ND1 where the driver transistor DR1 is formed. Similarly, a contact C6 supplied with the reference electric potential Vss is formed on the other side of the active area ND2 where the driver transistor DR2 is formed.

The gate fringe F1 of the load transistor LO1 is obliquely formed relative to the direction of gate width on the channel (channel width direction) in the load transistor LO1. In other words, the gate fringe F1 of the load transistor LO1 is obliquely formed relative to boundary lines 11C and 11D in the long side direction of the SRAM cell 11. The gate fringe F2 of the load transistor LO2 is also obliquely formed relative to the gate width direction on the channel in the load transistor LO2. In other words, the gate fringe F2 of the load transistor LO2 is obliquely formed relative to the boundary lines 11C and 11D.

For example, the gate width direction and the gate fringe F1 of the load transistor LO1 are arranged at an angle of about 20 degrees from each other. Similarly, the gate width direction and the gate fringe F2 of the load transistor LO2 are arranged at the angle of about 20 degrees from each other. Here, the gate fringe means an end portion of the gate electrode which projects from the active area and is present on the isolation area 12.

In the SRAM cell 11 having the layout in which the gate fringe of the load transistor is obliquely formed relative to the direction of gate width on the channel (channel width direction), compared with the conventional example shown in FIG. 1, the distance D1 between the gate fringe F2 of the load transistor LO2 and the gate fringe F3 of the transfer transistor TR1 can be lengthened. This allows the distance D1 between the gate fringes to be lengthened without increasing the size of the SRAM cell 11, so that the margin can be secured in the mask forming process and the resist forming process.

When the angle between the direction of the gate fringe F1 and the gate width direction of the load transistor LO1 is too large, since the distance between the gate fringe F1 and the gate electrode of the other load transistor LO2 in the SRAM cell 11 becomes small, the margin is reduced in the resist forming process. Therefore, it is desirable that the angle between the direction of the gate fringe and the gate width direction of the load transistor is formed to be up to about 20 degrees.

The gate fringe F3 of the transfer transistor TR3 is obliquely formed relative to the direction of gate width on the channel (channel width direction) in the transfer transistor TR1. In other words, the gate fringe F3 of the transfer transistor TR1 is obliquely formed relative to the boundary lines 11C and 11D in the long side direction of the SRAM cell 11. The gate fringe F4 of the transfer transistor TR2 is also obliquely formed relative to the gate width direction on the channel in the transfer transistor TR2. In other words, the gate fringe F4 of the transfer transistor TR2 is obliquely formed relative to the boundary lines 11C and 11D.

For example, the gate width direction and the gate fringe F3 of the transfer transistor TR1 are arranged to be at the angle of about 20 degrees. Similarly, the gate width direction and the gate fringe F4 of the transfer transistor TR2 are arranged to be at the angle of about 20 degrees.

In the SRAM cell 11 having the layout in which the gate fringe of the transfer transistor is obliquely formed relative to the direction of gate width on the channel (channel width direction), compared with the conventional example shown in FIG. 1, the distance D1 between the gate fringe F3 of the transfer transistor TR1 and the gate fringe F2 of the load transistor LO2 can be lengthened. This allows the distance D1 between the gate fringes to be lengthened without increasing the size of the SRAM cell 11, so that the margin can be secured in the mask forming process and the resist forming process.

Further, the distance between the gate fringe F3 of the transfer transistor TR1 and the shared contact SC1 can be lengthened, so that the short circuit between the gate fringe F3 and the shared contact SC1 can be decreased and defect probability can be decreased.

When the angle between the direction of the gate fringe F3 and the gate width direction of the transfer transistor TR1 is too large, the distance between the gate fringe F3 and the contact C3 connected to the bit line becomes small. Similarly, when the angle between the direction of the gate fringe F4 and the gate width direction of the transfer transistor TR2 is too large, the distance between the gate fringe F4 and the contact C4 connected to the bit line becomes small. Therefore, it is desirable that the angle between the gate fringe and the gate width direction of the transfer transistor is formed to be up to about 20 degrees.

In the conventional layout shown in FIG. 1, the gate electrode on the channel of the driver transistor in a certain SRAM cell and the gate electrode on the channel of the driver transistor of the adjacent SRAM cell are arranged on the same line parallel to the long side direction of the SRAM cell, and the gate fringes of the driver transistors are opposed to each other with the distance D2 on the same line.

On the other hand, in the first embodiment, gate fringes F5 and F6 of the driver transistors DR1 and DR2 are obliquely formed relative to the boundary lines 11C and 11D in the long side direction of the SRAM cell. In other words, the gate fringe F5 of the driver transistor DR1 is obliquely formed relative to the direction of gate width on the channel (channel width direction) in the driver transistor DR1, and the gate fringe F6 of the driver transistor DR2 is obliquely formed relative to the direction of gate width on the channel (channel width direction) in the driver transistor DR2.

For example, the gate width direction and the gate fringe F5 of the driver transistor DR1 are arranged to be at the angle of about 20 degrees. Similarly, the gate width direction and the gate fringe F6 of the driver transistor DR2 are arranged to be at the angle of about 20 degrees. The fringe F5 is bent (toward the side) opposite to the side in which the projection P of the gate electrode of the transfer transistor TR1 is formed, and the fringe F6 is bent (toward the side) opposite to the side in which the projection P of the gate electrode of the transfer transistor TR2 is formed.

In the SRAM cell 11 having the layout in which the gate fringe of the driver transistor is obliquely formed relative to the direction of gate width on the channel (channel width direction), compared with the conventional example shown in FIG. 1, the distance D2 between the gate fringe F5 of the driver transistor DR1 and the gate fringe of the driver transistor DR3 of the adjacent SRAM cell can be lengthened. Similarly, the distance between the gate fringe F6 of the driver transistor DR2 and the gate fringe of the driver transistor DR4 of the adjacent SRAM cell can be lengthened. This allows the distance D2 between the gate fringes to be lengthened without increasing the size of the SRAM cell 11, so that the margin can be secured in the mask forming process and the resist forming process. Further, the resist residue caused by approach of the gate fringe F5 or F6 to the projection P can be prevented.

When the angle between the gate fringe F5 and the gate width direction of the driver transistor DR1 is too large, the distance between the gate fringe F5 and the contact C5 supplied with the reference electric potential Vss becomes small. Similarly, when the angle between the gate fringe F6 and the gate width direction of the driver transistor DR2 is too large, the distance between the gate fringe F6 and the contact C6 supplied with the reference electric potential Vss becomes small. Therefore, it is desirable that the angle between the gate fringe and the gate width direction of the driver transistor is formed to be up to about 20 degrees.

As described above, in the first embodiment, the distance between the gate fringes can be lengthened in such a manner that the gate fringe of the above-described transistor is obliquely formed relative to the gate width direction (channel width direction), in other words, the gate fringe of the above-described transistor is obliquely formed relative to an extended direction of the gate electrode arranged on the active area. Accordingly, the length in the long side direction of the SRAM cell can be reduced while the margin is secured in the lithography process, so that the size in the long side of the SRAM cell can be reduced.

Though the angle can not be defined in the strict sense of the word, when the gate fringe is not formed straight but is formed with curvature effect of the first embodiment can be relished. Though FIG. 2 shows the example in which all the gate fringes of the load transistor, the transfer transistor, and the driver transistor are obliquely formed, only the gate fringe of at least any one of these transistors may be obliquely formed.

Second Embodiment

A semiconductor device of a second embodiment of the invention will be described below. In addition to the configuration of the above-described first embodiment, the shared contact is obliquely arranged in the second embodiment. The same areas and regions as those in the configuration of the first embodiment are indicated with the same reference numerals and signs and those descriptions are omitted. Only the areas and regions different from the first embodiment are described.

Figure 3:
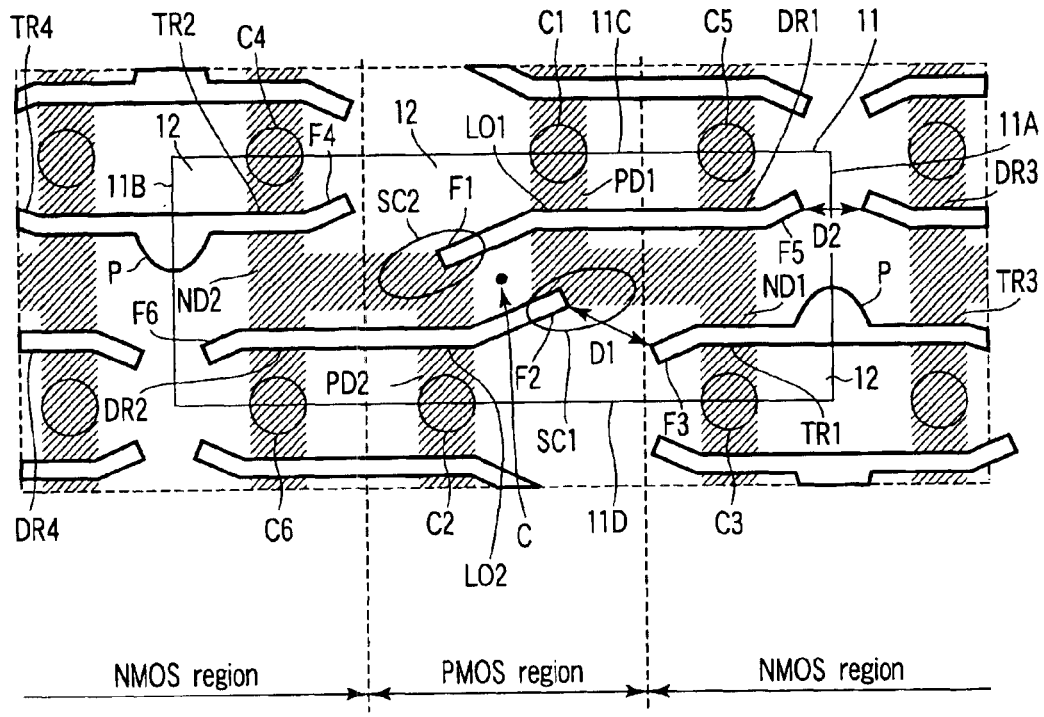
FIG. 3 is a plan view showing a configuration of a semiconductor device having a six-transistor type of SRAM cell formed on an SOI substrate according to a second embodiment of the invention.

FIG. 3 is a plan view showing a configuration of a semiconductor device having a six-transistor type of SRAM cell formed on an SOI substrate according to the second embodiment.

In the first embodiment, the major axis direction of the shared contact SC1 (or SC2) and the gate width direction (or the long side direction of the boundary line of the SRAM cell) of the load transistor LO2 (or load transistor LO1) are arranged at the angle of 90 degrees from each other.

In the second embodiment, as shown in FIG. 3, the major axis of the shared contact SC1 is obliquely arranged relative to the gate width direction of the load transistor LO2 (or the long side direction of the boundary line of the SRAM cell). Similarly, the major axis of the shared contact SC2 is obliquely arranged relative to the gate width direction of the load transistor LO1.

For example, the major axis direction of the shared contact SC1 and the gate width direction of the load transistor LO2 are arranged to be at the angle of about 20 to 30 degrees. Similarly, the major axis direction of the shared contact SC2 and the gate width direction of the load transistor LO1 are arranged to be at the angle of about 20 to 30 degrees.

In this manner, in the SRAM cell 11 having the layout described above, even if the size of the major axis of the shared contact is deviated, the deviation of the distance between the shared contact and the gate electrode can be reduced. Therefore, the size in the short side direction of the SRAM cell can be reduced.

As described above, in the second embodiment, the major axis direction of the shared contact is obliquely arranged relative to the gate width direction (or the long side direction of the boundary line of the SRAM cell) while the gate fringe of the transistor is obliquely formed relative to the gate width direction (channel width direction), so that the distance between the gate fringes can be lengthened and the deviation of the distance between the shared contact and the gate electrode can be reduced. Consequently, while the margin can be secured in the lithography process, the sizes of the long side and short side in the SRAM cell can be reduced, and the area of the SRAM cell can be also reduced.

Third Embodiment

A semiconductor device of a third embodiment of the invention will be described below. In the conventional layout shown in FIG. 1, the direction D3 of the minimum isolation width between the adjacent load transistors is parallel to the boundary line of the long side direction of the SRAM cell.

In the third embodiment, the longitudinal direction of the diffusion layer on a node side of the load transistor and the boundary lines 11C and 11D in the long side direction of the SRAM cell 11 are obliquely arranged. The diffusion layer on the node side of the load transistor means the diffusion layer to which the contact C1 supplied with the power supply voltage Vcc is not connected. That is, the diffusion layer on the node side means a source/drain diffusion layer which is arranged on the opposite side of a source/drain diffusion layer connected to the contact C1 supplied with the power supply voltage Vcc. Further, the gate width direction of the transistor, the major axis directions of the shared contacts SC1 and SC2 are obliquely arranged relative to the boundary lines 11C and 11D in the long side direction of the SRAM cell 11. The same areas and regions as those in the configuration of the first embodiment are indicated with the same reference numerals and signs and those descriptions are omitted. Only the areas and regions of the configuration different from the first embodiment are described.

Figure 4:
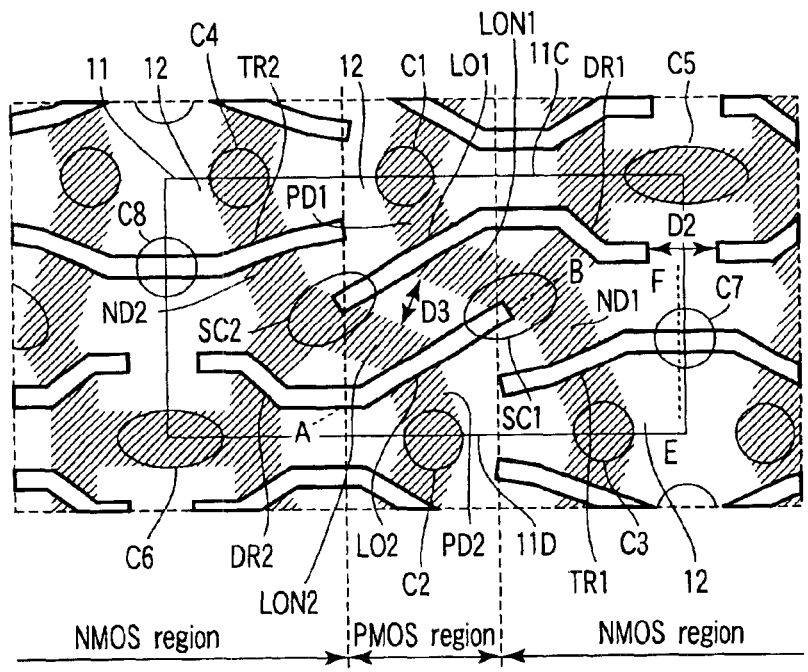
FIG. 4 is a plan view showing a configuration of a semiconductor device having a six-transistor type of SRAM cell formed on an SOI substrate according to a third embodiment of the invention.

FIG. 4 is a plan view showing a configuration of a semiconductor device having a six-transistor type of SRAM cell formed on an SOI substrate according to the third embodiment.

As shown in FIG. 4, a diffusion layer LON1 on the node side of the load transistor LO1 is obliquely arranged relative to the boundary lines 11C and 11D in the long side of the SRAM cell 11. The gate width direction of the load transistor LO1 is obliquely arranged relative to the boundary lines 11C and 11D in the long side of the SRAM cell 11.

Similarly, a diffusion layer LON2 on the node side of the load transistor LO2 is obliquely arranged relative to the boundary lines 11C and 11D in the long side of the SRAM cell 11. The gate width direction of the load transistor LO2 is obliquely arranged relative to the boundary lines 11C and 11D in the long side of the SRAM cell 11.

For example, the diffusion layer LON1 on the node side of the load transistor LO1 and the long side direction of the SRAM cell 11 are arranged at the angle of about 20 to 30 degrees from each other. Similarly, the diffusion layer LON2 on the node side of the load transistor LO2 and the long side direction of the SRAM cell 11 are arranged at the angle of about 20 to 30 degrees from each other.

Accordingly, the direction D3 of the minimum isolation width between the adjacent load transistors is arranged at the angle of 60 to 70 degrees relative to the boundary lines 11C and 11D in the long side direction of the SRAM cell 11.

In the SRAM cell 11 having the layout described above, the size in the long side direction of the SRAM cell 11 can be reduced to about 76% of the conventional example shown in FIG. 1. Since the same size as that of the conventional example can be secured in the short side direction of the SRAM cell 11, the cell area can be reduced to about 76% of the conventional example.

In the embodiment, the gate electrode of the transfer transistor TR1 (or TR2) does not have the projection P in the conventional example, and the gate electrode is formed with the pattern having the uniform width. It is desirable that the gate electrode of the transfer transistor TR1 (or TR2) is arranged to be across the center of a contact C7 (or C8). At this point, the width of the gate electrode in a contact portion between the gate electrode and the contact C7 (or C8) on the gate electrode of the transfer transistor TR1 (or TR2) is smaller than a diameter of the contact C7 (or C8). This arrangement allows the margin in the lithography process to be secured between the gate electrodes shown by the distance D2 while the increase in size in the short side direction of the SRAM cell 11 is suppressed.

The gate width direction on the channel of the driver transistor DR1 and the boundary lines 11C and 11D in the long side direction of the SRAM cell 11 are arranged at the angle of 35 to 45 degrees from each other. According to the arrangement, compared with the conventional example shown in FIG. 1, the channel width of the driver transistor DR1 is increased without increasing the cell size, so that static noise margin can be improved.

Since the distance between the adjacent shared contacts SC1 and SC2 can be secured at the same extent as the major axis, the resist forming process or the formation of the electrode can be stably performed.

A sectional structure of the semiconductor device of the third embodiment will be described below. FIG. 5 is a sectional view taken along line A–B of the semiconductor device shown in FIG. 4.

As shown in FIG. 5, the insulating film, e.g. an oxide film 22 is formed on a semiconductor substrate 21. Silicon layers 23A and 23B are formed as the active area in the oxide film 22. A gate insulating film 24 is formed on the silicon layer 23A, and a gate electrode 25 and a silicide layer 26 are formed on the gate insulating film 24. A sidewall film 27 on the gate side such as the oxide film is formed on side surfaces of the gate electrode 25 and the silicide layer 26.

A silicide layer 28 is formed on the silicon layer 23B. A tungsten film 29 is formed as the shared contact SC1 for connecting the silicide layers 26 and 28 on the silicide layers 26 and 28. An interlayer insulating film 30 is formed on the above-described structure, and a second interconnection 31 and a third interconnection 32 are formed in the interlayer insulating film 30.

FIG. 6 is a sectional view taken along line E–F of the semiconductor device shown in FIG. 4.

As shown in FIG. 6, the insulating film, e.g. the oxide film 22 is formed on the semiconductor substrate 21. The gate electrode 25 and the silicide layer 26 are formed on the oxide film 22. The sidewall film 27 on the gate side such as the oxide film is formed on side surfaces of the gate electrode 25 and the silicide layer 26.

The interlayer insulating film 30 is formed on the above-described structure. The tungsten film 29 is formed on the silicide layer 26 in the interlayer insulating film 30, and it is formed as the contact C7 for connecting the silicide layer 26 and a first interconnection 33. The first interconnection 33 is formed on the tungsten film 29, and the second interconnection 31 is formed on the first interconnection 33 through a contact 34 under the second interconnection. Further, the third interconnection 32 is formed above the second interconnection 31.

Figure 7:
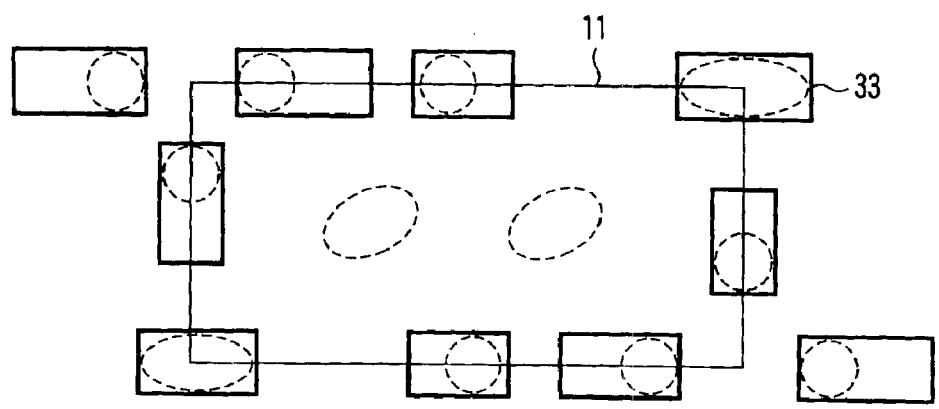
FIG. 7 shows a layout of a first interconnection and a pattern of a contact portion in the semiconductor device shown in FIG. 4.
Figure 8:
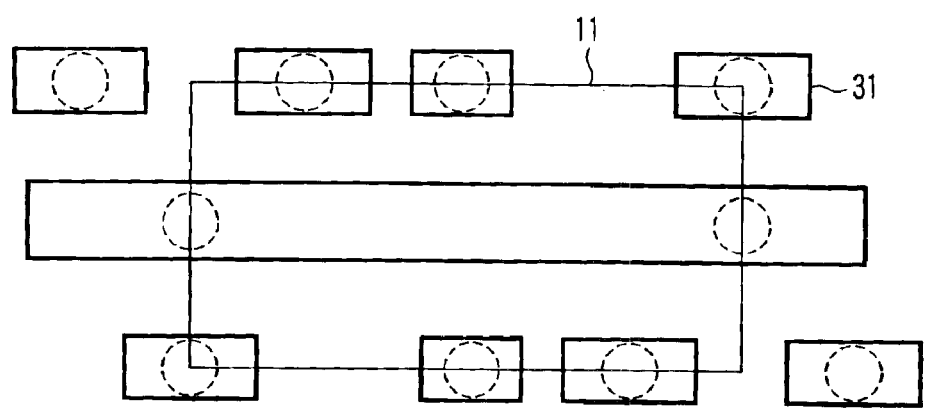
FIG. 8 shows a layout of a second interconnection and the pattern of the contact portion in the semiconductor device shown in FIG. 4.
Figure 9:
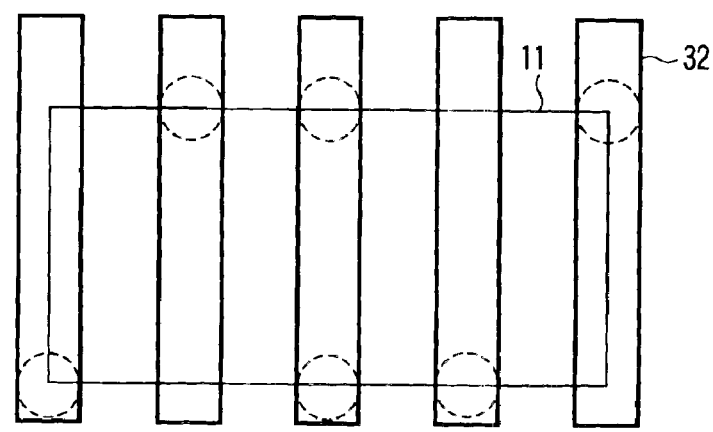
FIG. 9 shows a layout of a third interconnection and the pattern of the contact portion in the semiconductor device shown in FIG. 4.

FIG. 7 shows the first interconnection 33, the contact under the first interconnection, and the pattern of the shared contact in the SRAM cell shown in FIG. 4. FIG. 8 shows the second interconnection 31 and the pattern of the contact under the second interconnection, and FIG. 9 shows the third interconnection 32 and the pattern of the contact under the third interconnection. In FIGS. 7 to 9, the pattern of the contact is indicated by a broken line.

As described above, in the third embodiment, the diffusion layer on the node side of the load transistor is obliquely arranged relative to the long side direction of the SRAM cell, the gate electrode of the transfer transistor does not have the projection P, and the gate electrode is formed with the pattern having the uniform width. The gate width direction on the channel of the driver transistor and the long side direction of the SRAM cell 11 are arranged at the angle of 35 to 45 degrees from each other. According to the arrangement, the distance between the gate electrodes can be secured and the area of the SRAM cell can be reduced.

As described above, according to the embodiments of the invention, it is possible to provide the semiconductor device having the layout in which the area can be reduced and the margin of the lithography can be secured.

Not only each of the above-described embodiments can be individually realized, but also combination of the embodiments can be realized. Each of the above-described embodiments includes the invention of various kinds of steps, and the invention of various kinds of steps can be also extracted by the appropriate combination of the plurality of constitutions disclosed in each embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a first conductive type of first MOS transistor which is formed in a first active area and in which a gate is configured from a first gate electrode, the first gate electrode having an end portion projecting from the first active area;

a second active area arranged adjacent to the first active area;

a second conductive type of second MOS transistor which is formed in the second active area and in which a gate is configured from the first gate electrode;

a second conductive type of third MOS transistor which is formed in the second active area and in which a gate is configured from a second gate electrode;

a third active area formed apart from the first active area;

a first conductive type of fourth MOS transistor which is formed in the third active area and in which a gate is configured from a third gate electrode, the third gate electrode having an end portion projecting from the third active area;

a fourth active area arranged adjacent to the third active area;

a second conductive type of fifth MOS transistor which is formed in the fourth active area and in which a gate is configured from the third gate electrode; and a second conductive type of sixth MOS transistor which is formed in the fourth active area and in which a gate is configured from a fourth gate electrode, wherein the end portion of the first gate electrode projecting from the first active area is obliquely arranged relative to a gate width direction of the first MOS transistor, and the end portion of the third gate electrode projecting from the third active area is obliquely arranged relative to a gate width direction of the fourth MOS transistor.

2. A semiconductor device according to claim 1, wherein the first gate electrode has an end portion projecting from the second active area, the third gate electrode has an end portion projecting from the fourth active area, the end portion of the first gate electrode projecting from the second active area is obliquely arranged relative to a gate width direction of the second MOS transistor, and the end portion of the third gate electrode projecting from the fourth active area is obliquely arranged relative to a gate width direction of the fifth MOS transistor.

3. A semiconductor device according to claim 2, wherein the second gate electrode has an end portion projecting from the second active area, the fourth gate electrode has an end portion projecting from the fourth active area, the end portion of the second gate electrode projecting from the second active area is obliquely arranged relative to a gate width direction of the third MOS transistor, and the end portion of the fourth gate electrode projecting from the fourth active area is obliquely arranged relative to a gate width direction of the sixth MOS transistor.

4. A semiconductor device according to claim 1, wherein the first, second, and third MOS transistors are arranged in point symmetry on the basis of a central point between the first MOS transistor and the fourth MOS transistor relative to the fourth, fifth, and sixth MOS transistors.

5. A semiconductor device according to claim 4, wherein the first to sixth transistors configure a rectangular unit cell and other unit cells are arranged in line symmetry on the basis of each side of the unit cell outside the unit cell.

6. A semiconductor device according to claim 5, wherein the end portion of the first gate electrode projecting from the first active area and the end portion of the third gate electrode projecting from the third active area are obliquely arranged relative to a long side direction of the unit cell.

7. A semiconductor device according to claim 1, further comprising:
   a first shared contact which is commonly connected to the end portion of the first gate electrode projecting from the first active area and the third active area, and
   a second shared contact which is commonly connected to the end portion of the third gate electrode projecting from the third active area and the first active area.

8. A semiconductor device according to claim 7, wherein a major axis of the first shared contact and the end portion of the first gate electrode projecting from the first active area are arranged in the same direction, and
   a major axis of the second shared contact and the end portion of the third gate electrode projecting from the third active area are arranged in the same direction.

9. A semiconductor device according to claim 1, wherein the first to fourth active areas are formed on an insulating film.

10. A semiconductor device comprising:
    a first active area formed in an isolation area;
    a first conductive type of first MOS transistor which is formed in the first active area and in which a gate is configured from a first gate electrode, the first gate electrode having an end portion which projects from the first active area and resides in the isolation area;
    a second active area arranged adjacent to the first active area in the isolation area;
    a second conductive type of second MOS transistor which is formed in the second active area and in which a gate is configured from the first gate electrode;
    a second conductive type of third MOS transistor which is formed in the second active area and in which a gate is configured from a second gate electrode;
    a third active area formed apart from the first active area in the isolation area;
    a first conductive type of fourth MOS transistor which is formed in the third active area and in which a gate is configured from a third gate electrode, the third gate electrode having an end portion which projects from the third active area and resides in the isolation area;
    a fourth active area which is arranged adjacent to the third active area in the isolation area;
    a second conductive type of fifth MOS transistor which is formed in the fourth active area and in which a gate is configured from the third gate electrode; and
    a second conductive type of sixth MOS transistor which is formed in the fourth active area and in which a gate is configured from a fourth gate electrode,
    wherein the end portion of the first gate electrode present in the isolation area is obliquely arranged relative to an extended direction of the first gate electrode arranged on the first active area, and the end portion of the third gate electrode present in the isolation area is obliquely arranged relative to an extended direction of the third gate electrode arranged on the third active area.

11. A semiconductor device according to claim 10, wherein the first gate electrode has an end portion which projects from the second active area and resides in the isolation area, the third gate electrode has an end portion which projects from the fourth active area and resides in the isolation area, the end portion of the first gate electrode projecting from the second active area is obliquely arranged relative to a gate width direction of the second MOS transistor, and the end portion of the third gate electrode projecting from the fourth active area is obliquely arranged relative to a gate width direction of the fifth MOS transistor.

12. A semiconductor device according to claim 11, wherein the second gate electrode has an end portion which projects from the second active area and resides in the isolation area, the fourth gate electrode has an end portion which projects from the fourth active area and resides in the isolation area, the end portion of the second gate electrode projecting from the second active area is obliquely arranged relative to a gate width direction of the third MOS transistor, and the end portion of the fourth gate electrode projecting from the fourth active area is obliquely arranged relative to a gate width direction of the sixth MOS transistor.

13. A semiconductor device according to claim 10, wherein the first, second, and third MOS transistors are arranged in point symmetry on the basis of a central point between the first MOS transistor and the fourth MOS transistor relative to the fourth, fifth, and sixth MOS transistors.

14. A semiconductor device according to claim 13, wherein the first to sixth MOS transistors configure a rectangular unit cell and other unit cells are arranged in line symmetry on the basis of each side of the unit cell outside the unit cell.

15. A semiconductor device according to claim 14, wherein the end portion of the first gate electrode projecting from the first active area and the end portion of the third gate electrode projecting from the third active area are obliquely arranged relative to a long side direction of the unit cell.

16. A semiconductor device according to claim 10, further comprising;
    a first shared contact which is commonly connected to the end portion of the first gate electrode projecting from the first active area and the third active area, and
    a second shared contact which is commonly connected to the end portion of the third gate electrode projecting from the third active area and the first active area.

17. A semiconductor device according to claim 16, wherein a major axis of the first shared contact and the end portion of the first gate electrode projecting from the first active area are arranged in the same direction, and
    a major axis of the second shared contact and the end portion of the third gate electrode projecting from the third active area are arranged in the same direction.

18. A semiconductor device according to claim 10, wherein the first to fourth active areas are formed on an insulating film.

19. A semiconductor device comprising:
   a first conductive type of first MOS transistor which is formed in a first active area and in which a gate is configured from a first gate electrode, the first active area including a diffusion layer which is connected to a contact supplied with power supply voltage and a diffusion layer on a node side of the first MOS transistor, which is arranged on an opposite side of the diffusion layer connected to the contact;
   a second active area arranged adjacent to the first active area;
   a second conductive type of second MOS transistor which is formed in the second active area and in which a gate is configured from the first gate electrode;
   a second conductive type of third MOS transistor which is formed in the second active area and in which a gate is configured from a second gate electrode;
   a third active area formed apart from the first active area;
   a first conductive type of fourth MOS transistor which is formed in the third active area and in which a gate is configured from a third gate electrode, the third active area including a diffusion layer which is connected to a contact supplied with power supply voltage and a diffusion layer on a node side of the fourth MOS transistor, which is arranged on an opposite side of the diffusion layer connected to the contact;
   a fourth active area arranged adjacent to the third active area;
   a second conductive type of fifth MOS transistor which is formed in the fourth active area and in which a gate is configured from the third gate electrode; and
   a second conductive type of sixth MOS transistor which is formed in the fourth active area and in which a gate is configured from a fourth gate electrode,
   wherein the first to sixth MOS transistors configure a rectangular unit cell, a longitudinal direction of the diffusion layer on the node side of the first MOS transistor and a long side direction of the unit cell are arranged at an angle of 20 to 30 degrees from each other, and
   a longitudinal direction of the diffusion Layer on the node side of the fourth MOS transistor and the long side direction of the unit cell are arranged at an angle of 20 to 30 degrees from each other.

20. A semiconductor device according to claim 19, wherein the first, second, and third MOS transistors are arranged in point symmetry on the basis of a central point between the first MOS transistor and the fourth MOS transistor relative to the fourth, fifth, and sixth MOS transistors.

21. A semiconductor device according to claim 20, wherein other unit cells are arranged in line symmetry on the basis of each side of the unit cell outside the unit cell which consists of the first to sixth MOS transistor.

22. A semiconductor device according to claim 19, wherein the first gate electrode has an end portion projecting from the first active area, the third gate electrode has an end portion projecting from the third active area, the end portion of the first gate electrode projecting from the first active area and the end portion of the third gate electrode projecting from the third active area are obliquely arranged relative to a long side direction of the unit cell.

23. A semiconductor device according to claim 19, wherein the first gate electrode has an end portion projecting from the first active area, and the third gate electrode has an end portion projecting from the third active area, the semiconductor device further comprising:
   a first shared contact which is commonly connected to the end portion of the first gate electrode projecting from the first active area and the third active area; and
   a second shared contact which is commonly connected to the end portion of the third gate electrode projecting from the third active area and the first active area.

24. A semiconductor device according to claim 23, wherein a major axis of the first shared contact and the end portion of the first gate electrode projecting from the first active area are arranged in the same direction, and
   a major axis of the second shared contact and the end portion of the third gate electrode projecting from the third active area are arranged in the same direction.

25. A semiconductor device according to claim 19, wherein a gate width direction of the first MOS transistor and a gate width direction of the fourth MOS transistor are arranged at an angle of 20 to 30 degrees relative to the long side of the rectangular unit cell which is configured from the first to sixth MOS transistors.

26. A semiconductor device according to claim 19, wherein the first to fourth active areas are formed on an insulating film.

* * * * *